United States Patent
Belluomini et al.

(10) Patent No.: US 7,046,094 B2
(45) Date of Patent: May 16, 2006

(54) METHOD AND RING OSCILLATOR CIRCUIT FOR MEASURING CIRCUIT DELAYS OVER A WIDE OPERATING RANGE

(75) Inventors: Wendy Ann Belluomini, Austin, TX (US); Andrew Kenneth Martin, Austin, TX (US); Chandler Todd McDowell, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 10/793,460

(22) Filed: Mar. 4, 2004

(65) Prior Publication Data

US 2005/0195042 A1    Sep. 8, 2005

(51) Int. Cl.
*H03B 27/00*     (2006.01)
*G01R 23/00*     (2006.01)
(52) U.S. Cl. .......................................... 331/44; 331/57
(58) Field of Classification Search ................. 331/44, 331/57
See application file for complete search history.

(56) References Cited

U.S. PATENT DOCUMENTS

| 6,538,522 B1 | 3/2003 | Aipperspach et al. |
| 6,734,743 B1 * | 5/2004 | Korson et al. ................. 331/44 |
| 6,734,744 B1 * | 5/2004 | Monzel et al. ................. 331/57 |
| 6,741,136 B1 * | 5/2004 | Seo ............................. 331/74 |
| 6,909,301 B1 | 6/2004 | Korson et al. |

* cited by examiner

*Primary Examiner*—Joseph Chang
(74) *Attorney, Agent, or Firm*—Weiss, Moy & Harris, P.C.; Andrew M. Harris; Casimer K. Salys

(57) ABSTRACT

A method and ring oscillator circuit for measuring circuit delays over a wide operating range permits improved analysis of dynamic circuits. A pulse generator circuit provides a pulse to an input of a dynamic circuit under test, which may be a pre-charge or evaluation pulse that is triggered by a transition of an output of the dynamic circuit that occurs during the state opposite that of the state commanded by the pulse. The action of the circuit provides for measuring any amount of delay to the next transition in the opposite state irrespective of the pulse width. By providing a wide-range of operation, characteristics such as leakage, charge sharing, data dependent node capacitance, previous value dependence as well as other dynamic circuit behaviors may be determined. The ring oscillator circuit includes an enable start circuit that causes a first pulse to be generated by the one-shot when the ring oscillator circuit is enabled.

20 Claims, 4 Drawing Sheets

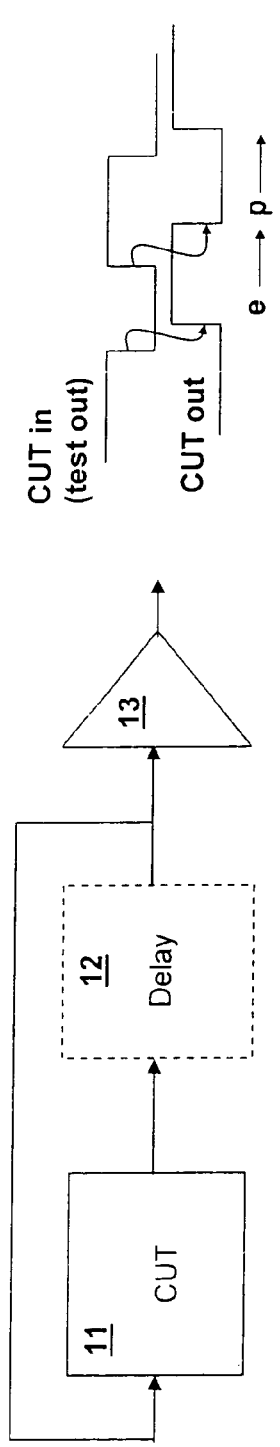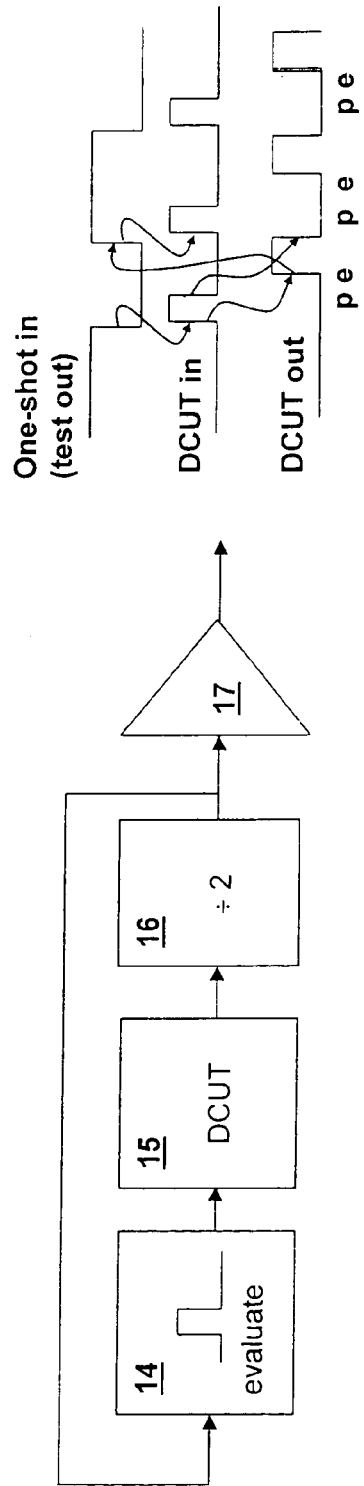
Fig. 1A (Prior Art)
Fig. 1B
Fig. 2A (Prior Art)
Fig. 2B

METHOD AND RING OSCILLATOR CIRCUIT FOR MEASURING CIRCUIT DELAYS OVER A WIDE OPERATING RANGE

BACKGROUND OF THE INVENTION

1. Technical Field

The present invention relates generally to test circuits for evaluating the performance of circuits incorporated on a semiconductor die, and more particularly, to a ring oscillator circuit for determining delays of digital circuits.

2. Description of the Related Art

Ring oscillators have been commonly used in evaluation of digital circuits delay times. Since the propagation delay time of digital circuits on a semiconductor die can be very short, especially at a single-gate level, direct measurement is difficult or impossible. The measuring equipment accuracy is generally limited by the same constraints as the circuit under test, and will typically have resolution and accuracy limitations that do not even approach the delay time of a single gate integrated on a semiconductor die. The use of a ring oscillator allows a simple frequency measurement to provide useful information about the delay time of a digital circuit. By connecting a number of circuits in series to form an inverting chain and providing feedback from the output of the circuit under test back to the input of the circuit under test, a measurement of the frequency of the ring oscillator formed by the above-described structure yields a measure of the delay times through the circuit under test.

Dynamic circuits, such as domino logic circuits, are often evaluated by a ring oscillator technique. For dynamic circuits, the pre-charge control (clock) is typically used as the feedback point and other logic inputs are set so as to provide an enabled inverting path through the logic. U.S. Pat. No. 6,538,522 describes such a test circuit.

However, the ring oscillator described in the above-referenced patent includes design constraints that limit the range over which the evaluation delay time of the dynamic circuit under test can vary, while still providing an accurate measurement. In particular, if the evaluation delay time is very short compared to the pre-charge delay time, accuracy and resolution of a measured evaluation time is reduced due to the dominance of the pre-charge time in the determination of the ring oscillator output frequency.

Further, in dynamic circuits it is desirable to measure changes in the evaluation state due to leakage and other phenomena that may occur long after evaluation commences. For example, a dynamic circuit may evaluate, but the time required for the output to change to another state due to leakage determines the evaluation "delay time" due to leakage, i.e. the length of time for which the dynamic gate output can be considered reliable.

The circuits described in the above-referenced patent, if designed to measure long evaluation periods, cannot then measure short evaluation periods, as the one-shot used to produce an evaluate pulse to the circuit under test must have a pulse width that is less than the evaluation time in order for the ring oscillator to oscillate, but not so much less that the pulse disappears and the circuit pre-charges again before the circuit has evaluated. Thus, the circuit described in the above-referenced patent requires control of two parameters: the maximum one-shot time and the minimum evaluate pulse width, making control of the circuit over wide operating ranges difficult or impossible.

Therefore, in order to measure widely varying evaluation and/or pre-charge times, multiple ring oscillator circuits according to the above-referenced patent would have to be implemented using differing one-shot times in order to provide a wide range of measurement.

It is therefore desirable to provide a test method and ring oscillator circuit system for measuring dynamic circuit characteristics that provides a wide measurement range of evaluation time and/or pre-charge time using a single test circuit. It is further desirable to provide such a circuit and method that do not require control of multiple circuit characteristics in order to perform the measurement. It is further desirable to provide such a circuit and method that can also measure evaluation leakage times.

SUMMARY OF THE INVENTION

The objectives of providing a single ring oscillator circuit and test method that can measure evaluate and/or pre-charge delay and leakage times in dynamic circuits are achieved in a test method and ring oscillator circuit that incorporate a delay element and latching circuit for producing a fixed-width pulse having a start time and end time dependent only on the starting edge of a state transition of interest of the output of the dynamic circuit under test that occurs in a state opposite that commanded by the pulse. The circuit is configured so that a transition occurs in the output of the dynamic circuit at the end of time period to be measured. For example, in a leakage measurement the evaluate and pre-charge states may set to be the same logic level, so that changes from the pre-charge state due to leakage may be observed, while for a delay measurement the logic is configured so that a state opposite from the pre-charge state is produced during the evaluate state so that a transition from the precharge or evaluate state may be observed.

The detected transition is used to start and end the next clock pulse by using a pulse generator circuit that generates a pulse of fixed width in response-to the detected transition. Thus, the ring oscillator will oscillate no matter the length of the measured delay, making the circuit suitable for measurement of evaluate changes due to leakage (long delay) as well as those due to the logic implementation (relatively short delay).

The ring oscillator circuit further includes a start circuit that forces the latching element to produce a first pulse so that ring oscillation is started. Further, the circuit may include a multi-tap multiplexer circuit for selecting a number of dynamic circuits used to form a composite dynamic circuit under test.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIG. 1A is a block diagram of prior art test circuit and FIG. 1B is a timing diagram depicting electrical signals within the test circuit of FIG. 1A.

FIG. 2A is a block diagram of another prior art test circuit and FIG. 2B is a timing diagram depicting electrical signals within the test circuit of FIG. 2A.

DESCRIPTION OF ILLUSTRATIVE EMBODIMENT

Figure 3A:
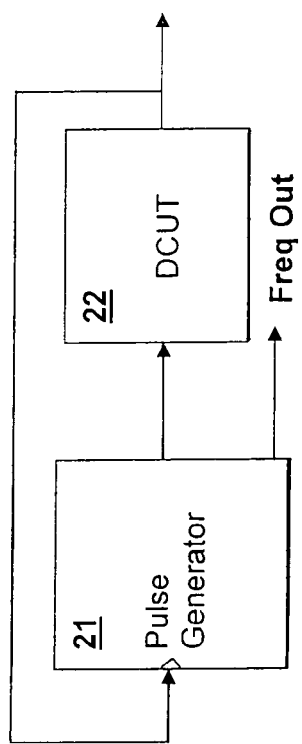
FIG. 3A is a block diagram of a test circuit in accordance with an embodiment, of the present invention

With reference now to the figures, and in particular with reference to FIG. 1A, there is depicted a prior art test circuit that forms a ring oscillator for generating a frequency that depends on the logic delays of the circuit chain. Circuit under test 11 is configured to provide an inverting path in combination with a delay circuit 12 so that changes occurring on the output of circuit under test 11 will cause further changes in the output of circuit under test 11 as they are returned to the input of circuit under test 11 after being delayed by delay circuit 12. Buffer 13 provides an output for measuring the frequency of the signal generated by the ring oscillator circuit, which has a period determined by the delay of delay circuit 12 and the sum of the two transition delay times of circuit under test 11.

Referring to FIG. 1B, the signals in the circuit of FIG. 1A are depicted in a timing diagram. The edge relationships are drawn-with arrows showing the causal action of each edge. The causal action is relatively simple in the circuit of FIG. 1A, as each edge in the output of circuit under test 11 causes an opposite polarity edge in the feedback signal-provided to the input of dynamic circuit under test 11 (assuming a non-inverting delay circuit 12 and an inverting circuit under test 11). The edge relationships are important to the understanding of the operation of the present invention, so the prior art is herein illustrated to show the operation of prior techniques. The circuit of FIG. 1A cannot differentiate between the two transition delays of circuit under test 11, which is generally a static CMOS circuit for which the rise time and fall time are measured together.

In dynamic logic circuits, generally the logic delay is determined by the time required to complete an evaluation period, which is controlled by one phase of the clock signal supplied to the dynamic circuit. The above-referenced U.S. Patent discloses a circuit more appropriate for dynamic circuit testing, and provides a method and circuit for measuring the evaluate time of a dynamic circuit under test.

Referring now to FIG. 2A, there is depicted a prior art test circuit as disclosed in the above-referenced Patent, that forms a ring oscillator for generating a frequency that depends on the evaluate delays of the circuit chain. Dynamic circuit under test 15 is configured to provide a non-inverting path in combination with a divider 16 and a one-shot circuit 14 so that changes occurring on the output of dynamic circuit under test 15 will cause further changes in the output of circuit under test 15 as they are returned to the input of circuit under test 15.

Divider 16 produces a signal that changes in response to the rising edge of the output of dynamic circuit under test 15 and one-shot 14 is designed to trigger on both edges of the output of divider 16, so that oscillation is sustained. Buffer 17 provides an output for measuring the frequency of the signal generated by the ring oscillator circuit, which has a period determined by the evaluate delay of dynamic circuit under test 15 plus the one-shot time of one-shot 14.

Referring to FIG. 2B, the signals in the circuit of FIG. 2A are depicted in a timing diagram. The edge relationships are drawn with arrows showing the causal action of each edge. The positive transition of the output of dynamic circuit under test 15 clocks divider 16 providing a state change that is detected by one-shot 14 and causes a pulse signal to be provided to the input of dynamic circuit under test 15 via the triggering of one-shot 14, which provides an evaluate pulse in response to each edge of the output of divider 16.

While the above-described circuit provides a solution for measuring the evaluate delay time of dynamic circuit under test 15, there are design constraints and limitations in the above-described circuit that make its use impractical for measurement of delays that vary across a wide range. Since the pulse produced by the one-shot is a pulse that commands the evaluate state in which the transition of interest occurs, the pulse width determines the maximum delay that can be measured. Also, the one-shot time determines the minimum delay that can be measured. In particular, the one-shot time must be such that the evaluate pulse is removed prior to the positive transition of the output of dynamic circuit under test 15 (as delayed by divider 16) so that one-shot 14 can be triggered again. Also, the pulse produced by one-shot must be long enough that an evaluate cycle is not canceled by an early pre-charge signal. In general, the one-shot time must be greater than the evaluate pulse width plus the pre-charge delay of dynamic circuit under test 15 minus the evaluation delay time. Therefore, the particular range of evaluation time to be measured must known in advance, so that the one-shot time may be chosen to satisfy the above limitations. Further, as the length of the pulse and the one-shot time of one-shot 14 form part of the period of the output of buffer 17, there are two fixed delays that must be considered in evaluating the frequency output of buffer 17 in order to determine the evaluation delay of dynamic circuit under test 15.

Referring now to FIG. 3A, a ring oscillator circuit in accordance with an embodiment of the present invention is shown. Circuit under test 22 is configured to provide an inverting path in combination with a pulse generator 21 so that changes occurring on the output of circuit under test 22 will cause further changes in the output of circuit under test 22 as they are returned to the input of circuit under test 22. However, the path through circuit under test may be non-inverting if pulse generator 21 is appropriately designed so that the trailing edge of the output of circuit under test 22 triggers pulse generation from pulse generator 21 so that oscillation is sustained. For a leakage delay measurement, a dynamic circuit under test 22 may be configured so that no commanded logic change occurs in response to the evaluate clock state, and any measured state change is produced by leakage during the evaluation phase. Thus in a leakage measurement circuit configuration, a leakage state change must be ensured for oscillation.

The primary distinction between ring oscillator circuit in accordance with the present invention and the prior art circuits described above (or other circuits that have undesirable properties) is that ring oscillator circuits in accordance with the present invention command the event to be measured from the end of the pulse generated by the pulse generator, rather than the beginning of the pulse. In general, this means that the total path through pulse generator 21 and circuit under test 22 is inverting—for example with an inverting circuit under test, the pulse generator generates a pulse on an edge having a same direction as the trailing edge of the output pulse. The following table shows a list of the possible arrangements of pulse generator trigger and output polarity (Pulse Gen Input Edge and Pulse Pol.), clock polarity of circuit under test 22 (Eval Pol.) and whether or not the path through circuit under test 22 is inverting (Total DCUT path). The desirable circuits are indicated in the last column, as well as a reference to exemplary figures provided in the descriptions below.

TABLE 1

| Ckt No. | Eval Pol. | Total DCUT path | Dynamic Measure-ment | Pulse Gen Input Edge | Pulse Pol. | Desirable? (related FIG) |
|---|---|---|---|---|---|---|
| 1 | H | Inv | precharge | + | + | Y (FIG. 3D) |
| 2 | H | Non-inv | precharge | − | + | Y (FIG. 3F) |
| 3 | L | Non-inv | precharge | + | − | Y (similar to FIG. 3D) |
| 4 | L | Inv | precharge | − | − | Y (similar to FIG. 3F) |
| 5 | H | Inv | eval | − | − | Y (3C) |
| 6 | H | Non-inv | eval | + | − | Y (3E) |
| 7 | L | Non-inv | eval | − | + | Y (similar to FIG. 3C) |
| 8 | L | Inv | eval | + | + | Y (similar to FIG. 3E) |
| 9 | H | Non-inv | eval | + | + | N (Prior Art ckt in FIG. 2A) |
| 10 | H | Inv | eval | − | + | N |
| 11 | L | Inv | eval | + | − | N |
| 12 | L | Non-inv | eval | − | − | N |
| 13 | H | Non-inv | precharge | − | − | N |
| 14 | H | Inv | precharge | + | − | N |
| 15 | L | Inv | precharge | − | + | N |
| 16 | L | Non-inv | precharge | + | + | N |

Referring again to FIG. 3A, pulse generator 21 generates a pulse of fixed duration to set a state of dynamic circuit under test 22 opposite to that containing the transition of interest, i.e. a pre-charge pulse for an evaluate delay measurement and vice-versa. Pulse generator 21 is designed so that both edges of the generated pulses are determined by an edge of the input of pulse generator 21, with the input and output polarity of pulse generator 21 determined in accordance with Table I for circuits 1–8, depending on the requisite polarity of the clock signal provided to circuit under test 22. The edge that triggers pulse generator 21 is the transition of interest at the output of dynamic circuit under test 22. A Freq Out output is provided from pulse generator 21 to permit frequency measurement of the oscillation frequency of the ring oscillator circuit, although any point in the circuit could be used that reflects the state change of the logic.

The test circuit of FIG. 3A is suitable for evaluating both common pre-charge dynamic circuits or domino logic where the pre-charge (clock) signal is changed by delay circuits that delay the clock signal so that cascaded clocking is supported. Since the pulse generator 21 output is providing assertion of the clock phase opposite to that for which a delay time is measured, the relative delay length with respect to the pulse width is affected only by an ability to measure the frequency accurately enough and to know the pulse generator 21 output pulse width and one-shot reset time within sufficient accuracy to determine the additional delay.

Figure 3B:
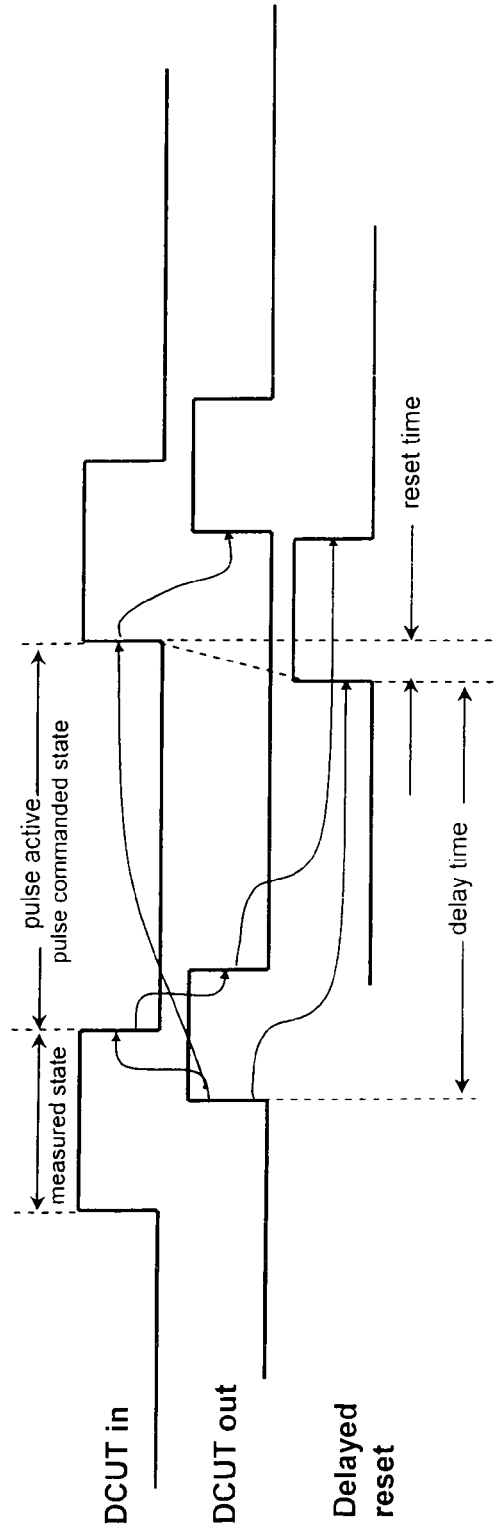
FIG. 3B is a timing diagram depicting electrical signals within the test circuit of FIG. 3A.

Referring to FIG. 3B, the signals in the circuit of FIG. 3A are depicted in a timing diagram. The edge relationships are drawn with arrows showing the causal action of each edge. The transition of interest of the output of dynamic circuit under test 22 (depicted as a rising edge) clocks pulse generator 21 providing a positive pulse having a predetermined width that commands a particular predetermined clock state of dynamic circuit under test 22 opposite to the state in which the transition of interest occurs. The timing diagram of FIG. 3B thus corresponds to circuits 1 and 8 (depending on the delay measurement type) of Table 1, but by changing the polarity of the signals depicted, applies to any of circuits 1–8 of Table 1. The clock state opposite the state commanded by the pulse, which is the state with which the measured delay time is associated, can be as long as needed to permit the transition of interest to be detected. In other words, the period of the opposite state (state of interest) lasts until a transition occurs.

In order to measure a leakage delay, the output of circuit under test 22 in the evaluation state and the pre-charge state are set (via design of the logic) to be the same. Then, leakage in the state of interest that causes a transition to occur after a long delay can be measured. In order to measure evaluation or pre-charge delay, the logic state to which the circuit under test evaluates (as opposed to "leaks") should be opposite the pre-charge value. FIG. 3B indicates operation of an exemplary circuit under test having a logical low output state until the transition of interest occurs, which may be a pre-charge transition for determining a pre-charge delay or may be an evaluate transition where the pre-charge is a pre-charge to a logical, low level as exemplified in the diagram. The bottom signal depicted in FIG. 3B (delayed reset signal) will be described with respect to the operation of the circuit of FIG. 4 below, as it is an internal signal reflecting operation of pulse generator 22.

Figure 3C:
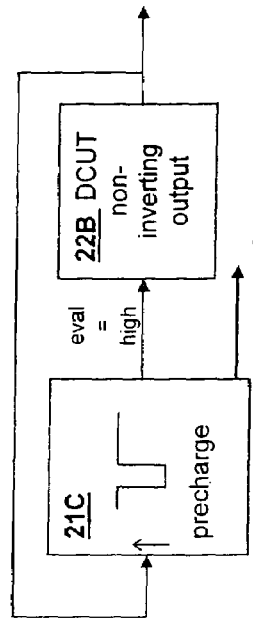
FIGS. 3C–3H are block diagrams of test circuits in accordance with alternative embodiments of the present invention.

Referring now to FIGS. 3C–3H various implementations of circuits in accordance with embodiments of the present invention are depicted. FIG. 3C depicts a pre-charge pulse generator 21A for driving a dynamic circuit under test 22A that has a clock input that commands the evaluate state in response to a positive clock input and further has an inverting characteristic (the evaluate state is logical low and the pre-charge state is logical high). The depicted circuit provides an indication of the evaluate time in the frequency of the Freq Out signal. The period of the Freq Out signal is the evaluate delay plus the fixed pre-charge pulse width plus the reset time (the time required for the pulse generator to trigger from the falling edge of the output of the dynamic circuit under test 22A).

Figure 3D:
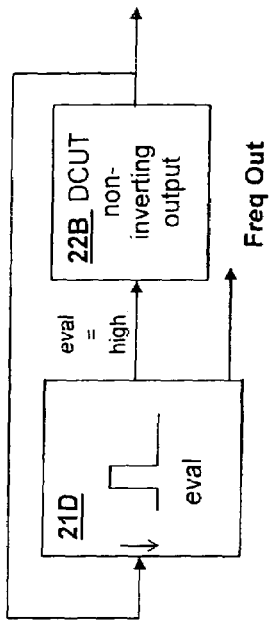

FIG. 3D depicts an evaluation pulse generator 21B for driving the same dynamic circuit under test 22A. The depicted circuit provides an indication of the pre-charge time in the frequency of the Freq Out signal. The period of the Freq Out signal is the precharge delay plus the fixed pre-charge pulse width plus the reset time (the time required for the pulse generator to trigger from the rising edge of the output of the dynamic circuit under test 22A).

Figure 3E:
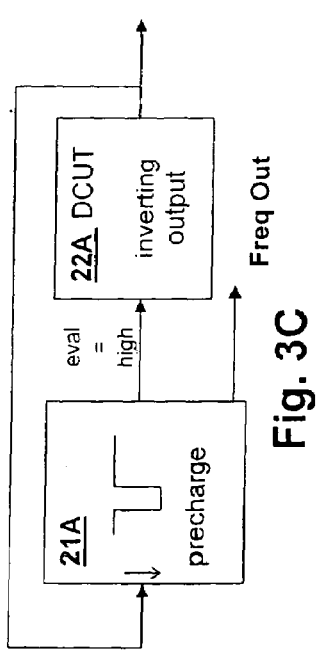

FIG. 3E depicts a pre-charge pulse generator 21C for driving a dynamic circuit under test 22B that has a clock input that commands the evaluate state in response to a positive clock input and further has a non-inverting characteristic (the evaluate state is logical high and the pre-charge state is logical low). The depicted circuit provides an indication of the evaluate time in the frequency of the Freq Out signal. The period of the Freq Out signal is the evaluate delay plus the fixed pre-charge pulse width plus the reset time (the time required for the pulse generator to trigger from the rising edge of the output of the dynamic circuit under test 22B). The contrast between the circuit of FIG. 3C and the circuit of FIG. 3E is the inverting or non-inverting nature of the circuit under test and that the trigger edge of pulse generator 21C is inverted to maintain triggering on the proper edge of the output of dynamic circuit under test 22B.

Figure 3F:
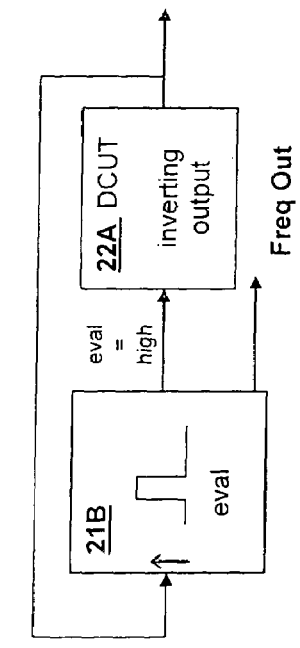

FIG. 3F depicts an evaluation pulse generator 21D for driving the same dynamic circuit under test 22B depicted in the circuit of FIG. 3D. The depicted circuit provides an indication of the pre-charge time in the frequency of the Freg Out signal. The period of the Freq Out signal is the pre-charge delay plus the fixed pre-charge pulse width plus the reset time (the time required for the pulse generator to trigger from the falling edge of the output of the dynamic circuit under test 22A). The contrast between the circuit of FIG. 3D and the circuit of FIG. 3F is the inverting or non-inverting nature of the circuit under test and that the trigger edge of pulse generator 21D is inverted to maintain triggering on the proper edge of the output of dynamic circuit under test 22B.

Figure 3H:
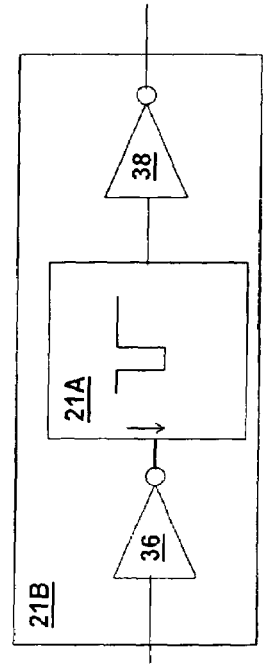
Figure 3G:
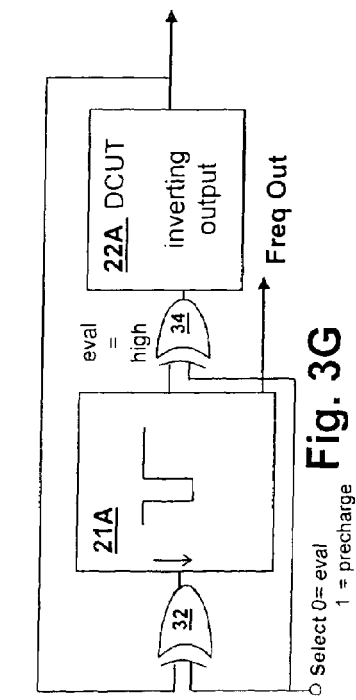

FIG. 3G depicts a circuit having a selectable delay measuring frequency characteristic. Exclusive-OR gate 32 provides inversion of the trigger edge of pulse generator 21A and exclusive-OR gate 34 provides inversion of the pulse state (and thus the clock state commanded by an active pulse). When the Select input is set to a logical "0" state, the frequency at Freg Out is proportional to the evaluate delay of circuit under test 22A and when the Select input is set to a logical "1" state, the frequency at Freq Out is proportional to the pre-charge delay of circuit under test 22A.

Evaluate leakage delay measurements may be made in the evaluate delay measurement circuits illustrated above by setting the logic of the circuit under test to evaluate to the same logical value as the pre-charge value. The pulse generator will then trigger only on a leakage event that occurs when the pre-charge leaks off of an internal node of the circuit under test.

FIG. 3H is provided to illustrate transformation of a pulse generator 21A to produce pulse generator 21B. By providing an inverter 36 at the input of pulse generator 21A, the edge on which the pulse generator triggers is inverted. Inverter 38 provides inversion of the generated negative pulse to provide a positive pulse that commands the opposite clock state of a circuit under test. (By using only a single inverter 36 on the input pulse generator 21A, positive-edge-triggered negative precharge pulse generator 21C can be produced, and by using only a single inverter 38 on the output of pulse generator 21A the negative-edge triggered positive evaluate pulse generator 21D can be produced.) In general, there are four other circuit types corresponding to dynamic circuit types having a low-logic-level evaluate input. For these inverted clock circuits, an inverter on the output of the pulse generator illustrated in the corresponding one of FIGS. 3C–3F will provide proper circuit operation. Similarly, an inverter or logic to provide an inverted select signal at the input of exclusive-OR gate 34 may be provided to provide proper operation in the circuit of FIG. 3G when a circuit under test having a low-logic-level evaluate input is substituted for dynamic circuit under test 22A.

Figure 4:
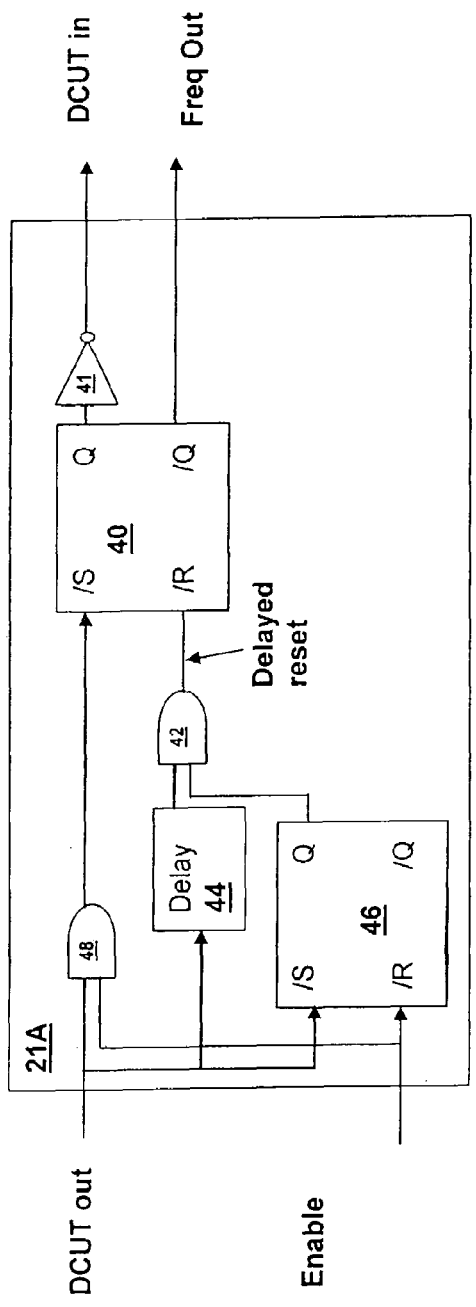
FIG. 4 is a circuit diagram depicting details of pulse circuit 21 of FIG. 3A in accordance with an embodiment of the present invention.

Referring now to FIG. 4, details of pulse generator 21A are depicted. Set-reset flip-flop 40 provides negative pulse output signal DCUT in via an inverter 41 and frequency measurement signal Freg Out. Set-reset flip-flop 40 is set by the falling edge of the DCUT out signal, which provides the next pulse commanding the state opposite of state of interest. The pulse lasts until set-reset flip-flop 40 is reset by the falling output of delay 44, which provides a delayed reset signal as depicted in FIG. 3B. The delayed reset signal is a delayed version of the DCUT out signal. The use of the delayed configuration permits the pulse to be generated entirely dependent on the transition of interest, so that the output frequency of the test circuit varies only with the delay being measured. A logical AND gate 42 combines the delayed reset signal with an output of another set-reset flip-flop 46 that provides for enabling the delayed reset signal onto the reset input of set-reset flip-flop 40 when the DCUT out signal has set set-reset flip-flop 46 for the first time after the external enable signal has been asserted. Logical AND gate 48 enables the set signal from DCUT out in response to the enable signal as well. The above-described circuit thus is disabled until the enable signal is asserted and then a pulse is produced by setting set-reset flip-flop 40. The DCUT out is also coupled to the set input of set-reset flip-flop 46 to enable logical AND gate 42 at the first transition of interest. Logical AND gate 42 prevents the reset input of set-reset flip-flop 40 from blocking generation of the first pulse produced by pulse generator 21A after the enable signal is asserted. The other pulse generator circuits recited above can be produced from the circuit of FIG. 4 by addition of inverters on the input, Ioutput or both the input and output of pulse generator 21A as described above with reference to FIG. 3H.

Figure 5:
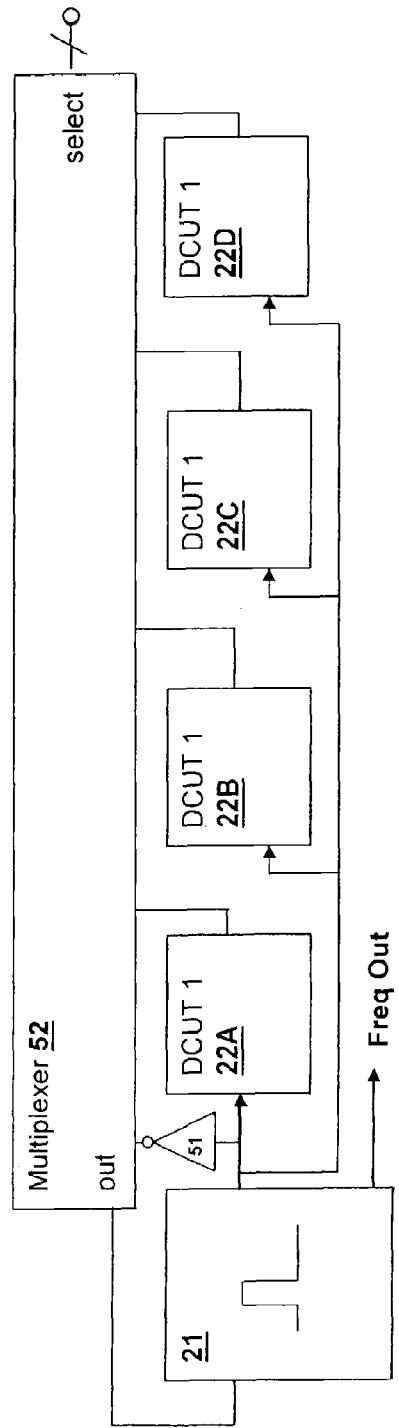
FIG. 5 is a circuit diagram of a test circuit using pulse circuit 21 and having a multiplexer for selecting among multiple dynamic test circuits in accordance with another embodiment of the present invention.

Referring now to FIG. 5, a multiplexed test circuit is depicted comprising multiple dynamic circuits 22A–22D each having an output connected to an input of multiplexer 52. Pulse generator 21 is connected to the output of multiplexer 52 so that a selectable DCUT out signal (selected by one or more select inputs) is provided to the input of pulse generator 21. A Freq Out signal is provided from pulse generator 21 just as in the circuit of FIG. 3A. Selection of one of multiple dynamic circuits provides more flexibility in measurement than a single dynamic circuit, and multiple measurements can be used to assist in accurately removing the effect of the pulse width and the input delay of pulse generator 21 on the frequency of the Freq Out signal.

While the above-illustrations show circuits for measuring pre-charge and evaluate delays of dynamic circuits, the above circuits and techniques may also be applied to static circuits in order to provide separate measurements rise and fall times through the static logic. The techniques may also be applied to hybrid static and dynamic circuits as well.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A ring oscillator for determining characteristics of circuit performance, said ring oscillator comprising:
   a pulse generator for producing a pulse of predetermined duration in response to a transition of a single predetermined polarity at an input of said pulse generator, and wherein said pulse generator generates both edges of said pulse solely in response to said transition; and
   a circuit under test for which said characteristics are determined, and having an input coupled to an output of said pulse generator and an output coupled to said input of said pulse generator, whereby said circuit under test is placed in a predetermined state when said pulse is active and a time interval associated with a delay of said circuit under test in a state opposite from said predetermined state may be determined from a frequency of an output of said pulse generator, and wherein a next pulse of said pulse generator is triggered by a next transition of said output of said circuit under test occurring in response to said circuit under test entering said opposite state.

2. The ring oscillator circuit of claim 1, wherein said circuit under test is a dynamic circuit, wherein said pulse is an pre-charge clock pulse and wherein said predetermined clock state is an evaluate state of said dynamic circuit under test, and wherein said delay is associated with an evaluate state of said dynamic circuit.

3. The ring oscillator circuit of claim 2, wherein said delay is an evaluate delay time period of said dynamic circuit, and wherein said dynamic circuit under test is configured so that said next transition is produced by a change from said evaluate state due a logic state commanded by said pulse generator output terminating said pulse.

4. The ring oscillator circuit of claim 2, wherein said delay is an evaluate leakage time period of an internal node of said dynamic circuit, and whereinsaid dynamic circuit under test is configured so that said next transition is produced by a change from said evaluate state due to leakage from said internal node.

5. The ring oscillator circuit of claim 1, wherein said circuit under test is a dynamic circuit, wherein said pulse is an evaluate clock pulse and wherein said predetermined clock state is a pre-charge state of said dynamic circuit under test, and wherein said delay is a pre-charge delay of said dynamic circuit.

6. The ring oscillator circuit of claim 1, wherein said pulse generator has a select input for selecting a value of said predetermined polarity and a polarity of said pulse, whereby said pulse commands one of a first state and a second state of said circuit under test in conformity with a state of said select input, whereby delay times associated with said first state and said second state may be selectively determined in conformity with said frequency and a state of said select input.

7. The ring oscillator circuit of claim 6, wherein said circuit under test is a dynamic circuit, wherein said input of said dynamic circuit is a clock input of said dynamic circuit and wherein said select input selectively programs said polarity of said pulse to command one of an evaluate clock state and a pre-charge clock state of said dynamic circuit.

8. The ring oscillator circuit of claim 1, wherein said pulse generator circuit comprises:
a first set-reset flip-flop having a set input coupled to said input of said pulse generator; and
a delay circuit having an input coupled to said input of said pulse generator and having an output coupled to a reset input of said first set-reset flip-flop for producing a delay substantially equal to said predetermined duration of said pulse, and wherein and output of said first set-reset flip-flop is coupled to said output of said pulse generator, whereby said pulse is started by said predetermined transition of said set input and terminated by a transition at said reset input due to expiration of said delay.

9. The ring oscillator circuit of claim 8, further comprising an enable start circuit coupled to said reset input for disabling said reset input in response to an enable signal, whereby said pulse generator is started to produce a first pulse.

10. The ring oscillator circuit of claim 9, wherein said enable start circuit comprises:
a logical AND gate having an output coupled to said reset input of said first flip-flop and a first input coupled to said output of said delay circuit; and a second set-reset flip-flop having a set input coupled to said enable signal, a reset input coupled to said output of said dynamic circuit under test and an output coupled to a second input of said logical AND gate, whereby said first set-reset flip-flop is enabled to produce said first pulse.

11. The ring oscillator circuit of claim 1, wherein said circuit under test comprises a plurality of individual circuits, and wherein said ring oscillator circuit further comprises a multiplexer circuit for selecting among outputs of said individual circuits, said multiplexer having an output coupled to an input of said pulse generator, whereby a characteristic delay of a selected one or said plurality of individual circuits having an input coupled to an output of said pulse generator and an output selected by a select input of said multiplexer is determined from said frequency.

12. The ring oscillator circuit of claim 11, wherein said plurality of circuits are dynamic circuits each having a clock input coupled in common to said output of said pulse generator to each of said individual dynamic circuits.

13. The ring oscillator circuit of claim 1, wherein said circuit under test is a domino logic circuit having internal inter-stage clock delay circuits.

14. The ring oscillator circuit of claim 1, wherein said circuit under test is formed from a plurality of dynamic logic stages each having a pre-charge input connected in common to a clock input coupled to said output of said pulse generator.

15. A method of evaluating a characteristic delay of a circuit under test, said method comprising:
generating a pulse of fixed predetermined duration at an input of said circuit under test, whereby said test circuit is placed in a predetermined state while said pulse is active;
allowing said circuit under test to enter a state opposite that of said predetermined state after termination of said generated pulse;
detecting a change in an output of said circuit under test in said opposite clock state; and
second generating a next pulse of said fixed predetermined duration at said input of said circuit under test in response to said detected change, whereby a time interval between said termination of said generated pulse and said detecting provides a measure of said characteristic delay of said circuit under test in said opposite state by determining a frequency of said generating.

16. The method of claim 15, wherein said circuit under test is a dynamic circuit, wherein said pulse is a pre-charge pulse and wherein said predetermined state is a pre-charge state of said dynamic circuit, and wherein a time period associated with said evaluate state is determined from said frequency.

17. The method of claim 15, wherein said circuit under test is a dynamic circuit, wherein said pulse is an evaluate pulse and wherein said predetermined state is an evaluate state of said dynamic circuit, whereby a time period associated with said pre-charge state is determined from said frequency.

18. The method of claim 15, wherein said circuit under test is a dynamic circuit, wherein said time period is a leakage time period of an internal node of said circuit under test, and wherein said dynamic circuit is configured so that said detected change is a change from a normal value of said predetermined clock state due to leakage from said internal node.

19. The method of claim 15, further comprising selecting a polarity of said generated pulse and a polarity of said detecting, whereby said one of two states of said circuit under test state is selected as said predetermined state.

20. A ring oscillator for determining characteristics of dynamic circuit performance, said ring oscillator comprising:
- a dynamic circuit under test for which said characteristics are determined, and having a clock input and an output;
- first set-reset flip-flop having a set input coupled to said output of said dynamic circuit under test whereby a pulse is commenced at an output of said first set-reset flip-flop in response to a predetermined transition of said set input;
- a logical AND gate having an output coupled to a reset input of said first flip-flop;
- a delay circuit having an input coupled to said output of said dynamic circuit under test and having an output coupled to an input of said logical AND gate for terminating said pulse after a predetermined delay, whereby said dynamic circuit under test is placed in a predetermined clock state when said pulse is active and a time interval associated with an opposite state from said predetermined clock state may be determined from a frequency of an output of said first setreset flip-flop; and
- a second set-reset flip-flop having a reset input coupled to an enable signal for starting a measurement of said characteristics, a set input coupled to said output of said dynamic circuit under test and an output coupled to a second input of said logical AND gate, whereby said first setreset flip-flop is enabled to produce a first pulse from said first setreset flip-flop.

\* \* \* \* \*